United States Patent

Yonemori et al.

[11] Patent Number: 6,144,239
[45] Date of Patent: Nov. 7, 2000

[54] SEMICONDUCTOR INTEGRATED CIRCUIT WITH PHASE ADJUSTING FUNCTION AND SYSTEM USING THE SAME

[75] Inventors: Shigeki Yonemori; Isao Sezaki, both of Kanagawa, Japan

[73] Assignee: NEC Corporation, Tokyo, Japan

[21] Appl. No.: 09/102,517

[22] Filed: Jun. 22, 1998

[30]  Foreign Application Priority Data

Jun. 24, 1997 [JP] Japan .................................... 9-166742

[51] Int. Cl.[7] ...................................................... H03L 7/06
[52] U.S. Cl. ........................... 327/158; 327/161; 375/376
[58] Field of Search ..................................... 327/141, 155, 327/156, 157, 158, 159, 161, 162; 375/373–376

[56]  References Cited

U.S. PATENT DOCUMENTS

| | | | |
|---|---|---|---|
| 4,941,156 | 7/1990 | Stern et al. | 375/372 |
| 5,446,867 | 8/1995 | Young et al. | 713/503 |
| 5,677,858 | 10/1997 | Takeda et al. | 708/313 |

FOREIGN PATENT DOCUMENTS

| | | |
|---|---|---|
| 63-217452 | 9/1988 | Japan . |
| 3-52185 | 3/1991 | Japan . |
| 3-205920 | 9/1991 | Japan . |
| 4-82099 | 3/1992 | Japan . |
| 4-318400 | 11/1992 | Japan . |
| 5-88036 | 11/1993 | Japan . |
| 9-161472 | 6/1997 | Japan . |

*Primary Examiner*—Timothy P. Callahan
*Assistant Examiner*—Minh Nguyen

[57]  ABSTRACT

A semiconductor integrated circuit includes a register for storing a designated value and a delay element group for delaying an input signal by a delay quantity set based on the designated value to output the signal delayed by the delay quantity as a delay signal. The semiconductor integrated circuit further includes a PLL circuit for inputting the delay signal and a clock signal and for outputting a phase adjustment signal. In this case, the phase adjustment signal is supplied to the delay element group as the input signal.

15 Claims, 4 Drawing Sheets

SEMICONDUCTOR INTEGRATED CIRCUIT WITH PHASE ADJUSTING FUNCTION AND SYSTEM USING THE SAME

BACKGROUND OF THE INVENTION

1. Field of the Invention

The present invention relates to a semiconductor integrated circuit and more particularly relates to a semiconductor integrated circuit in which the phase of a circuit is adjusted by the phase adjusting function of a PLL circuit.

2. Description of the Related Art

A circuit in which a PLL circuit is controlled by a register is disclosed in Japanese Laid-Open Patent Application (JP-A-Heisei 3-205920). FIG. 1 shows the structure of such a conventional circuit.

Referring to FIG. 1, a phase synchronizing circuit is composed of a PLL circuit and a register 507. In this case, the PLL circuit is composed of a phase comparator 502, a charge pump 503, a filter 504, and a VCO 505 (voltage controlled oscillator). The phase comparator 502 compares the frequency and phase of a code data 1 501 with a feedback signal. The charge pump 503 outputs a constant current for a time period corresponding to the phase difference obtained as the comparing result by the phase comparator 502. The filter 504 converts the current output from the charge pump 503 into a corresponding voltage. The VCO 505 generates a clock signal Sync Clock 506 with the frequency corresponding to the voltage outputted from the filter 504. The register 507 stores information of a gain quantity and a filter constant and the like for the respective circuits of the PLL circuit.

In this reference, at least one of the gain of the charge pump 503, the constant of the filter 504, and the central frequency of the voltage controlled oscillator 505 is changed.

The phase synchronizing circuit is further composed of a micro-computer bus 508 for writing data in the register 507, a CPU 509 for computing the whole data, a HDC (hard disc controller) 510 in which a program for controlling the whole system is stored, and a RAM or a ROM 511. In the RAM or the ROM 511, data such as the program for the CPU 509 and the most appropriate setting values are stored.

In the phase synchronizing circuit, the CPU 509 selects setting values for the PLL circuit from the data stored in the RAM or the ROM 511. Then, the CPU 509 writes the selected values in the register 507 through the micro-computer bus 508 such that the values are sent to each of the circuits of the PLL circuit. The PLL circuit changes the gain of the charge pump, the filter constant, and/or the central frequency of the VCO.

In the above-mentioned technique, in case of use of the phase adjusting function of the PLL circuit, the output of the PLL circuit is connected with a delay element group as an input signal. The delay element group delays the output of the PLL circuit by a delay quantity determined by the delay element group to generate a phase adjusting signal. The phase synchronizing circuit adjusts the difference in phase between the input signal and the phase adjusting signal.

However there is a problem in that the delay quantity can not be changed after a LSI including the phases synchronizing circuit is manufactured and mounted on a printed circuit board.

When another LSI is connected with the phase synchronizing circuit to use one common clock signal, the other LSI does not operate normally because the phase adjustment time of the phase synchronizing circuit is fixed.

SUMMARY OF THE INVENTION

The present invention is accomplished in view of the above problems. Therefore, an object of the present invention is to provide a semiconductor integrated circuit, in which the phase adjustment time is variable after the semiconductor integrated circuit is manufactured and mounted on a printed circuit board.

Another object of the present invention is to provide a semiconductor integrated circuit, in which when the semiconductor integrated circuit is connected with another semiconductor integrated circuit using a common clock signal, the other semiconductor integrated circuit can be normally operate.

In order to achieve an aspect of the present invention, a semiconductor integrated circuit includes a register for storing a designated value, a delay element group for delaying an input signal by a delay quantity set based on the designated value to output the signal delayed by the delay quantity as a delay signal and a PLL circuit for inputting the delay signal and a clock signal and for outputting a phase adjustment signal,wherein the phase adjustment signal is supplied to the delay element group as the input signal.

In this case, a semiconductor integrated circuit further includes latch circuits for latching data which is written in and is read from another circuit in response to a latch signal, the other circuit being supplied with the clock signal, wherein the phase adjustment signal is supplied to the latch circuits as the latch signal.

In order to achieve another aspect of the present invention, a phase control circuit including a semiconductor integrated circuit and a control unit, wherein the semiconductor integrated circuit comprises a register for storing a designated value, a delay element group for delaying an input signal by a delay quantity set based on the designated value to output the signal delayed by the delay quantity as a delay signal, a PLL circuit for inputting the delay signal and a clock signal and for outputting a phase adjustment signal, a first latch circuit for latching a write data, which is written in another circuit, in response to a latch signal, the other circuit being supplied with the clock signal, a second latch circuit for latching a read data, which is read from the other circuit, in response to the latch signal, wherein the phase adjustment signal is supplied to the delay element group as the input signal and is supplied to the latch circuits as the latch signal, wherein the control unit sequentially supplies predetermined values to the register as the designated value and judges whether the write data is coincident with the read data, each time the predetermined value is supplied to the register, the designated value being held in the register, when both of the read and write data are judged to be coincident with each other.

In this case, the control unit may sequentially supply the predetermined values to detect a range of the predetermined values in which the write data and the read data are coincident with each other.

Also the control unit may select the designated value from among the predetermined values in the range. Further the control unit may select an intermediate value among the predetermined values in the range as the designated value.

In this case, the PLL circuit comprises a phase comparator, a charge pump and a voltage controlled oscillator.

In order to achieve still another aspect of the present invention, a semiconductor integrated circuit apparatus including a plurality of semiconductor integrated circuits connected with each other in parallel, wherein each of the plurality of semiconductor integrated circuits includes a register for storing a designated value, a delay element group for delaying an input signal by a delay quantity set based on the designated value to output the signal delayed by the delay quantity as a delay signal, and a PLL circuit for inputting the delay signal and a clock signal and for outputting a phase adjustment signal, wherein the phase adjustment signal is supplied to the delay element group as the input signal, and the clock signal is supplied in common to the PLL circuits of the semiconductor integrated circuits.

In this case, each of the plurality of semiconductor integrated circuits further includes a first latch circuit for latching a write data, which is written in another circuit, in response to a latch signal, the clock signal being supplied to the other circuit, a second latch circuit for latching a read data, which is read from the other circuit, in response to the latch signal, wherein the phase adjustment signal outputted from each of the plurality of PLL circuits is supplied to the first and second latch circuits corresponding to the each PLL circuit as the latch signal.

In order to achieve yet another aspect of the present invention, a phase control circuit including a plurality of semiconductor integrated circuits connected with each other in parallel, and a control section, wherein each of the plurality of semiconductor integrated circuits includes a register for storing a designated value, a delay element group for delaying an input signal by a delay quantity set base on the designated value to output the signal delayed by the delay quantity as a delay signal, a PLL circuit for inputting the delay signal and a clock signal and for outputting a phase adjustment signal, a first latch circuit for latching a write data, which is written by the control section in another circuit, in response to a latch signal, the other circuit being supplied with the clock signal and a second latch circuit for latching a read data, which is read by the control section from the other circuit, in response to the latch signal, wherein the clock signal is supplied in common to the PLL circuits of the semiconductor integrated circuits, wherein the phase adjustment signal outputted from each of the plurality of PLL circuits is supplied to the first and second latch circuits corresponding to the each PLL circuit as the latch signal, wherein the control section sequentially supplies predetermined values to the register of each of the semiconductor integrated circuits as the designated value and judges respectively whether the write data is coincident with the read data, each time the predetermined value is supplied to the register, the designated value being held respectively in the register, when both of the read and write data are judged to be coincident with each other.

In this case, the control section sequentially supplies respectively the predetermined values to detect a range of the predetermined values in which the write data and the read data are coincident with each other.

Also in this case, the control section selects respectively the designated value from among the predetermined values in the range.

Further the control section may select respectively an intermediate value among the predetermined values in the range as the designated value.

In order to achieve still another aspect of the invention, a phase controlling method includes the steps of storing a designated value in a register, delaying an input signal by a delay quantity set based on the designated value to output a signal delayed by the delay quantity as a delay signal, locking phase of a clock signal based on the delay signal to output a phase adjustment signal as the input signal, latching in latch circuits a read data and write data for another circuit in response to the phase adjustment signal as a latch signal, the other circuit being supplied with the clock signal, supplying sequentially predetermined values to the register as the designated value, judging whether the read data and the write data are coincident with each other and holding the predetermined value in the register when the read data and the write data are judged to be coincident with each other.

In this case, the judging step includes supplying sequentially the predetermined values to detect a range of the predetermined values in which the write data and the read data are coincident with each other.

Also the judging step may include selecting the designated value from among the predetermined values in the range.

Further, the judging step may include selecting an intermediate value among the predetermined values in the range as the designated value.

In order to achieve yet another aspect of the present invention, a phase controlling method, includes the steps of supplying a clock signal in common to a plurality of PLL circuits, storing a designated value in a register corresponding to each of the PLL circuits, delaying an input signal by a delay quantity set based on the designated value to output a signal delayed by the delay quantity as a delay signal, supplying the delay signal to each of the PLL circuits to output a phase adjustment signal, latching in latch circuits corresponding to the each PLL circuit a read data and write data for another circuit in response to the phase adjustment signal as a latch signal, the other circuit being supplied with the clock signal, supplying sequentially predetermined values to the register as the designated value, judging respectively whether the read data and the write data are coincident with each other and holding the predetermined value in the register when the read data and the write data are judged to be coincident with each other.

In this case, the judging step may include supplying sequentially the predetermined values to detect a range of the predetermined values in which the write data and the read data are coincident with each other.

Also in this case, the judging step may include selecting the designated value from among the predetermined values in the range.

DESCRIPTION OF THE PREFERRED EMBODIMENTS

Next, the phase synchronizing circuit of the present invention will be described below in detail with reference to the attached drawings.

Figure 1:
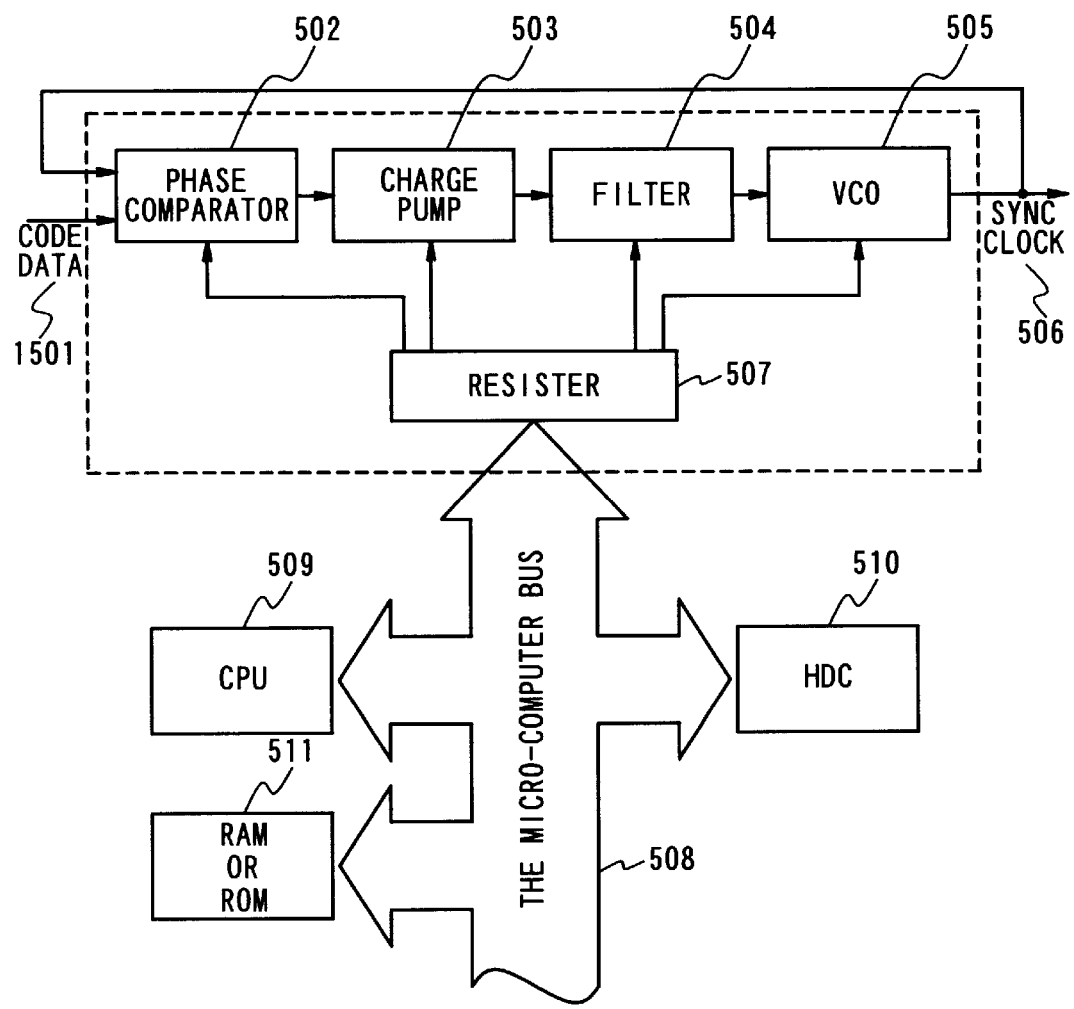
FIG. 1 is a block diagram illustrating the structure of a conventional phase synchronizing circuit.
Figure 2:
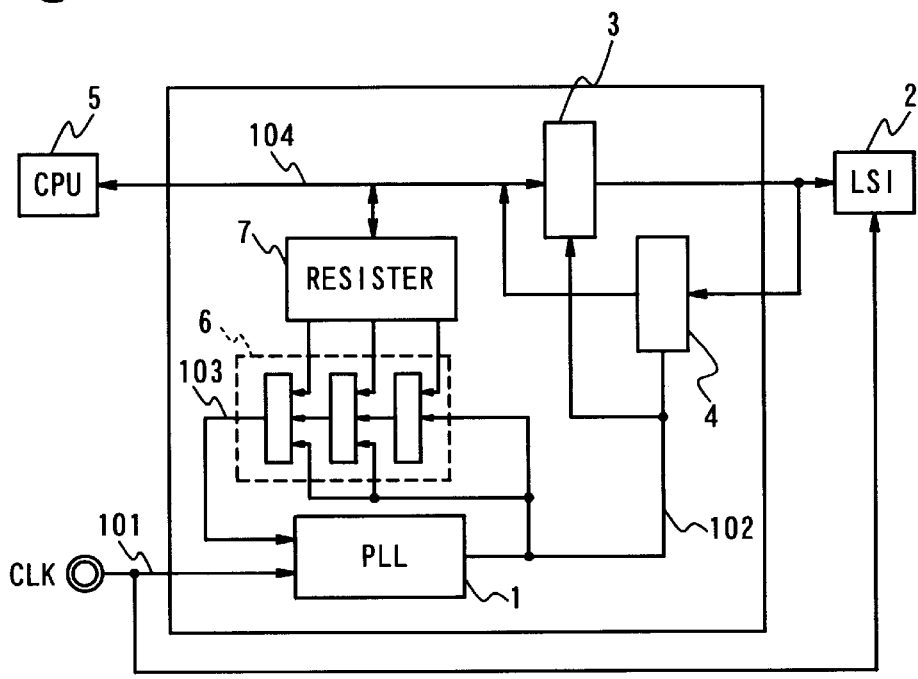
FIG. 2 is a block diagram illustrating the structure of a phase synchronizing circuit according to a first embodiment of the present invention.
Figure 3:
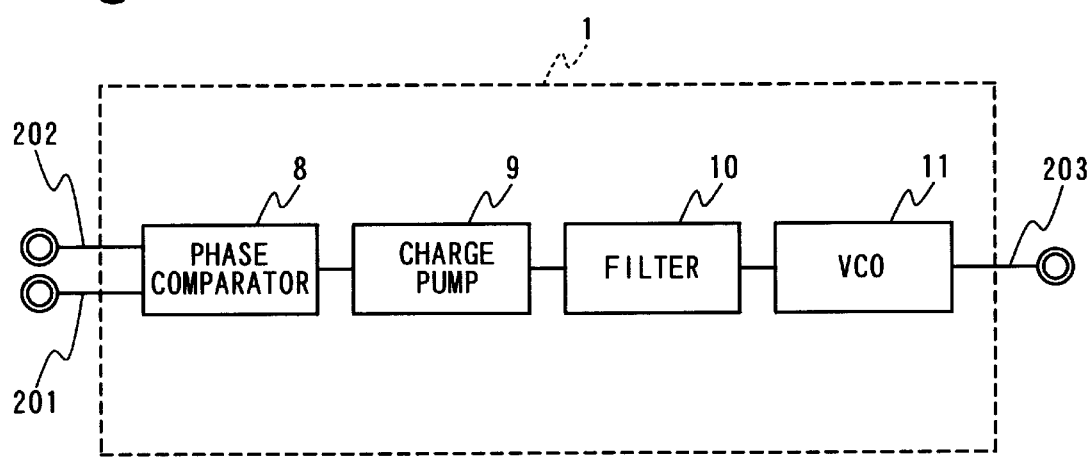
FIG. 3 is a block diagram illustrating the structure of a PLL circuit used in the phase synchronizing circuit according to the first embodiment of the present invention.

FIG. 2 is a block diagram illustrating the structure the phase synchronizing circuit according to a first embodiment of the present invention. The phase synchronizing circuit uses a phase adjustment function of a PLL circuit. FIG. 3 illustrates the structure of the PLL circuit.

As shown in FIG. 3, the PLL circuit is composed of a phase comparator 8, a charge pump 9, a filter 10 and a voltage controlled oscillator (VCO) 11, as in the conventional example. The phase comparator 8 compares a first input signal 201 with a second input signal 202. The charging pump 9 is connected with the phase comparator 8 and outputs a predetermined current for a time period corresponding to a phase difference which is obtained as the comparing result by the phase comparator 8. The filter 10 is connected with the charging pump 9, and converts the current outputted by the charging pump 9 to a voltage. The VCO 11 is connected with the filter 10, and generates a clock signal 203 having a frequency which corresponds to the voltage outputted from the filter 10.

Referring to FIG. 2, the phase synchronizing circuit in the first embodiment will be described. The phase adjusting function of the PLL circuit is applied to the phase synchronizing circuit.

The phase synchronizing circuit is composed of the above-mentioned PLL circuit 1, a delay element group 6, a register 7, latch circuits 3 and 4. The phase synchronizing circuit is connected with a control circuit (CPU) 5 and an LSI as another circuit 2.

A clock signal CLK 101 is a phase adjusted signal. The clock signal CLK 101 is provided to the LSI 2 and the PLL circuit 1. A phase adjusting signal as the output 102 of the PLL circuit 1 is provided to the latch circuits 3 and 4, and the delay element group 6. The phase adjusting signal is delayed by the delay element group 6 and supplied to the PLL circuit 1 as a delayed adjusting signal. The delay quantity by the delay element group 6 is determined based on a value set in the register 7. This value is rewritable by the control circuit 5.

The clock signal CLK 101 is phase-adjusted in accordance with the delayed adjusting signal 103. The output 102 is supplied to the latch circuits 3 and 4. The write data 104 is outputted from the CPU 5 and is latched by the latch circuit 3. The write data is outputted from the latch circuit 3 and is written into the other LSI 2. The other LSI 2 operates in response to the clock signal CLK 101. The read data is read from the other LSI 2 and is latched by latch circuit 4. Then, the read data 104 is outputted from the latch circuit 4 and supplied to the control circuit 5. The control circuit (CPU) 5 confirms whether the write data and the read data are coincident with each other.

Next, the operation of the phase synchronizing circuit according to the first embodiment of the present invention will be described.

Figure 4:
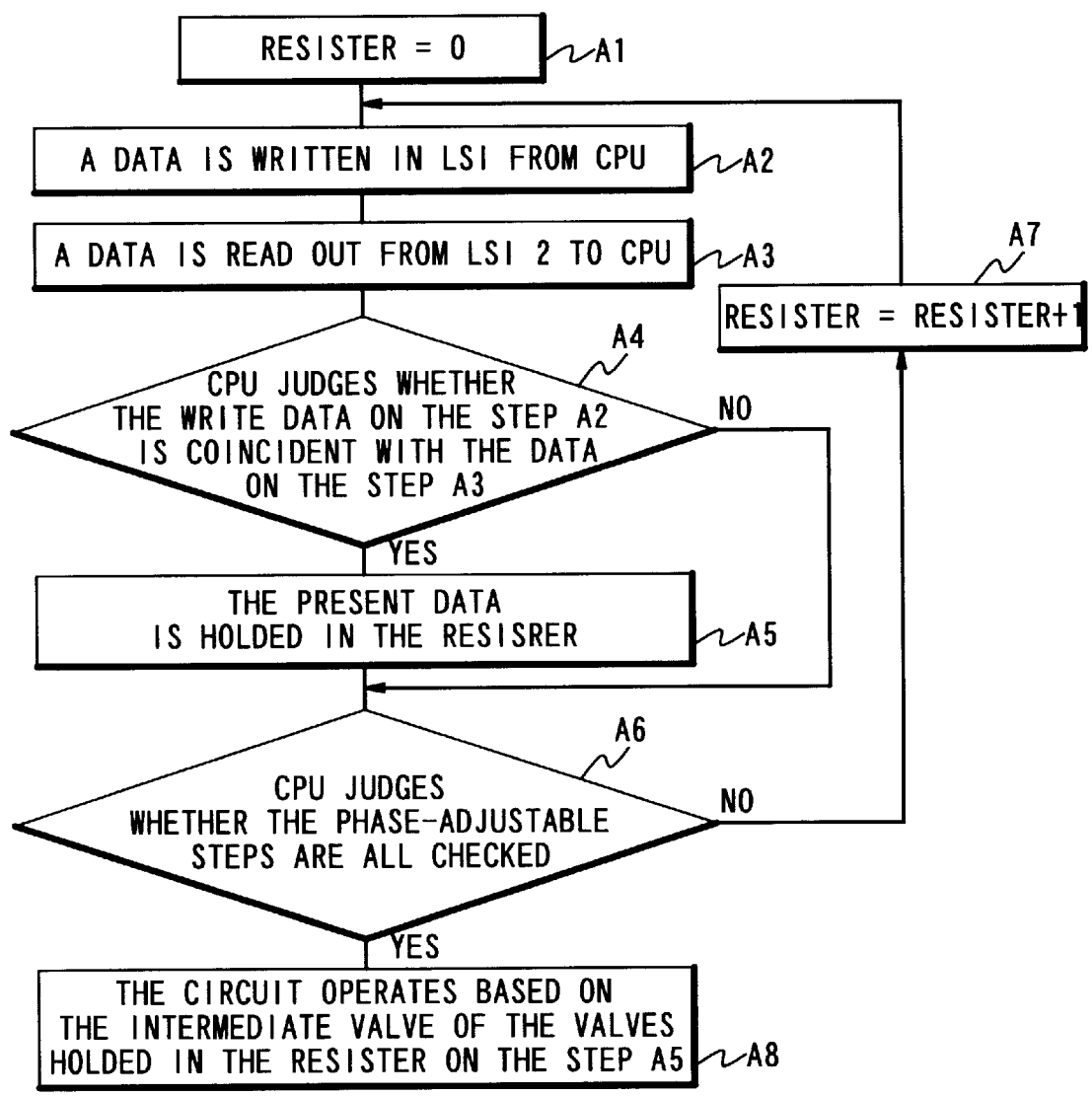
FIG. 4 is a flow chart illustrating to describe the operation of the phase synchronizing circuit according, to the first embodiment of the present invention.

FIG. 4 is a flow chart to describe the operation of the phase synchronizing circuit in the first embodiment. Referring to FIG. 4, the operation of selecting the delay quantity will be described below.

The register 7 is set to zero (Step A1). Then, a write data is written into the other LSI 2 from the control circuit (CPU) 5 via the latch circuit 3 (Step A2). Then, the control circuit reads the written data as a read data from the other LSI 2 (Step A3). Subsequently, the control circuit 5 judges whether the written data written in the step A2 is coincident with the read datum read in the step A3 (Step A4). If both of the data are coincident with each other, the data set in the register 7 is stored in the control circuit 5. If not, the data is not stored, and the control is advanced to the step A6 without executing the step A5.

In the step A6, it is judged whether the process from the steps A2 to the steps A5 is executed to all the data in a phase adjustable range. If not, one is added to the register 7 (step A7), and the judging process from the step A2 to step A5 is repeated.

After the data in the phase adjustable range are all checked, the central value of the data of the register 7 stored in the control circuit 5 when the write data and the read data are coincident with each other is set to the register 7 again (step A8).

Thus, a phase adjustment time can be determined through the above-mentioned process.

Figure 5:
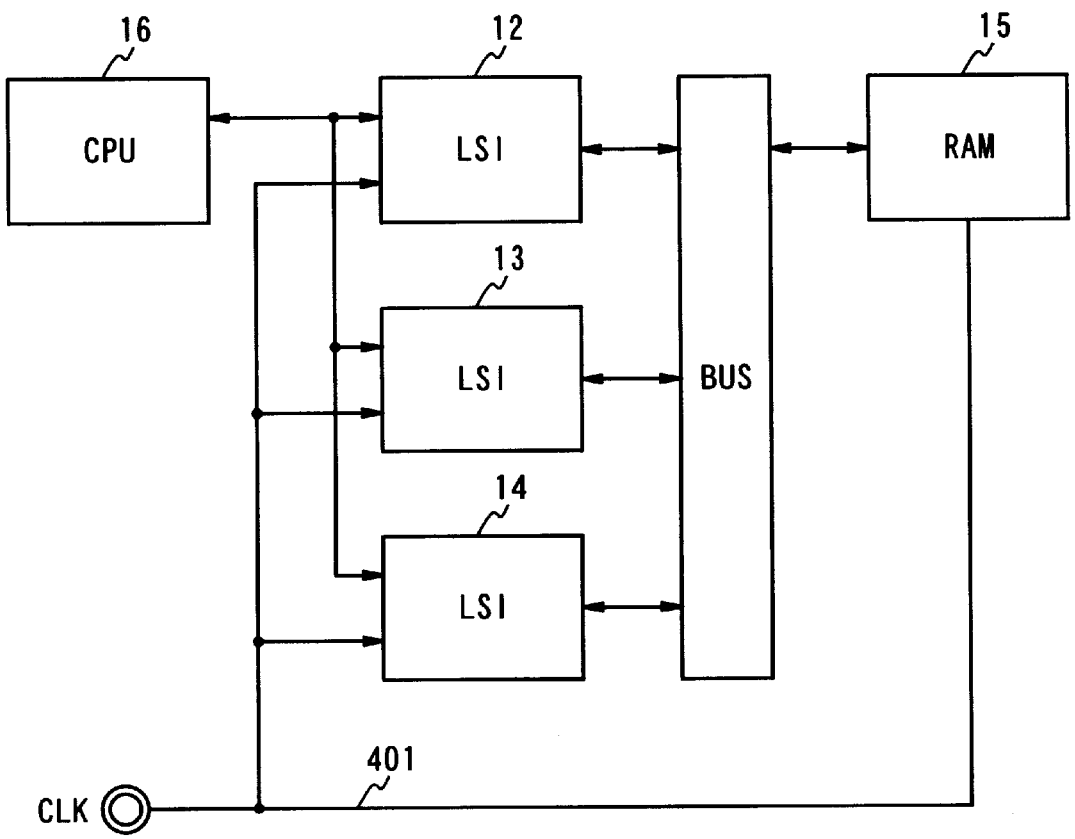
FIG. 5 is a block diagram illustrating the structure of a phase synchronizing system according to a second embodiment of the present invention.

Next, the phase synchronizing circuit according to the second embodiment of the present invention. FIG. 5 is a block diagram illustrating the structure of the phase synchronizing system according to the second embodiment of the present invention.

Referring to FIG. 5, a clock signal CLK 401 as a phase adjusted signal is connected with LSIs 12, 13, and 14, which are the same phase synchronizing circuit as described in the first embodiment. The clock signal is further connected with a RAM 15 as another circuit. As described with respect to the operations in FIG. 2, the control circuit (CPU) 16 writes a write data in the RAM 15 through the LSI 12 and bus, and reads the data from the RAM 15 as the read data through the LSI 12 and a bus. The above-mentioned confirming process for determining whether the write data and read data are coincident with each other is performed for all the data of the register 7 in the phase adjustable range. When the confirming process is completed, the central value of the data of the register 7 which are stored in the control circuit 16 is set to the register 7 of the LSI 12. These steps are performed with respect to the LSIs 13 and 14. Thus, the LSIs are operable with different phase adjusted times.

As described above, according to the semiconductor integrated circuit including the phase synchronizing circuit of the present invention, phase adjustment can be accomplished even after the semiconductor integrated circuit is manufactured and mounted on a printed circuit board.

What is claimed is:

1. A phase control circuit comprising a semiconductor integrated circuit and a control unit,
    wherein said semiconductor integrated circuit comprises:
        a register for storing a designated value;
        a delay element group for delaying an input signal by a delay quantity set based on said designated value to output said input signal delayed by said delay quantity as a delay signal;
        a PLL circuit for inputting said delay signal and a clock signal and for outputting a phase adjustment signal; and
        a first latch circuit for latching a write data, which is written in another circuit, in response to a latch signal, said other circuit being supplied with said clock signal,
        a second latch circuit for latching a read data, which is read from said other circuit, in response to said latch signal,
        wherein said phase adjustment signal is supplied to said delay element group as said input signal and is supplied to said latch circuits as said latch signal,
        wherein said control unit sequentially supplies predetermined values to said register as said designated value and judges whether said write data is coincident with said read data, each time said predetermined value is supplied to said register, said designated value being held in said register, when both of said read and write data are judged to be coincident with each other.

2. A phase control circuit according to claim 1, wherein said control unit sequentially supplies said predetermined values to detect a range of said predetermined values in which said write data and said read data are coincident with each other.

3. A phase control circuit according to claim 2, wherein said control unit selects said designated value from among said predetermined values in the range.

4. A phase control circuit according to claim 3, wherein said control unit selects an intermediate value among said predetermined values in the range as said designated value.

5. A phase control circuit including a plurality of semiconductor integrated circuits connected with each other in parallel, and a control section, wherein each of said plurality of semiconductor integrated circuits comprises:

a register for storing a designated value;

a delay element group for delaying an input signal by a delay quantity set base on said designated value to output said input signal delayed by said delay quantity as a delay signal;

a PLL circuit for inputting said delay signal and a clock signal and for outputting a phase adjustment signal; and a first latch circuit for latching a write data, which is written by said control section in another circuit, in response to a latch signal, said other circuit being supplied with said clock signal, a second latch circuit for latching a read data, which is read by said control section from the other circuit, in response to said latch signal, wherein said clock signal is supplied in common to said PLL circuits of said semiconductor integrated circuits, wherein said phase adjustment signal outputted from each of said plurality of PLL circuits is supplied to said first and second latch circuits corresponding to said each PLL circuit as said latch signal wherein said control section sequentially supplies predetermined values to said register of each of said semiconductor integrated circuits as said designated value and judges respectively whether said write data is coincident with said read data, each time said predetermined value is supplied to said register, said designated value being held respectively in said register, when both of said read and write data are judged to be coincident with each other.

6. A phase control circuit according to claim 5, wherein said control section sequentially supplies respectively said predetermined values to detect a range of said predetermined values in which said write data and said read data are coincident with each other.

7. A phase control circuit according to claim 6, wherein said control section selects respectively said designated value from among said predetermined values in the range.

8. A phase control circuit according to claim 7, wherein said control section selects respectively an intermediate value among said predetermined values in the range as said designated value.

9. A phase controlling method, comprising the steps of;

storing a designated value in a register, delaying an input signal by a delay quantity set based on said designated value to output a signal delayed by said delay quantity as a delay signal, locking phase of a clock signal based on said delay signal to output a phase adjustment signal as said input signal, latching in latch circuits a read data and write data for another circuit in response to said phase adjustment signal as a latch signal, said other circuit being supplied with said clock signal, supplying sequentially predetermined values to said register as said designated value, judging whether the read data and the write data are coincident with each other, holding said predetermined value in said register when the read data and the write data are judged to be coincident with each other.

10. A phase control method according to claim 9, wherein said judging step includes:

supplying sequentially said predetermined values to detect a range of said predetermined values in which said write data and said read data are coincident with each other.

11. A phase control method according to claim 10, wherein said judging step includes:

selecting said designated value from among said predetermined values in the range.

12. A phase control method according to claim 11, wherein said judging step includes:

selecting an intermediate value among said predetermined values in the range as said designated value.

13. A phase controlling method, comprising the steps of;

supplying a clock signal in common to a plurality of PLL circuits, storing a designated value in a register corresponding to each of said PLL circuits, delaying an input signal by a delay quantity set based on said designated value to output a signal delayed by said delay quantity as a delay signal, supplying said delay signal to each of said PLL circuits to output a phase adjustment signal, latching in latch circuits corresponding to said each PLL circuit a read data and write data for another circuit in response to said phase adjustment signal as a latch signal, said other circuit being supplied with said clock signal, supplying sequentially predetermined values to said register as said designated value, judging respectively whether the read data and the write data are coincident with each other, holding said predetermined value in said register when the read data and the write data are judged to be coincident with each other.

14. A phase control method according to claim 13, wherein said judging step includes:

supplying sequentially said predetermined values to detect a range of said predetermined values in which said write data and said read data are coincident with each other.

15. A phase control method according to claim 14, wherein said judging step includes:

selecting said designated value from among said predetermined values in the range.

* * * * *